United States Patent [19]

Sheng et al.

[11] Patent Number: 5,057,893
[45] Date of Patent: Oct. 15, 1991

[54] STATIC RAM CELL WITH SOFT ERROR IMMUNITY

[75] Inventors: David Sheng; Yasunobu Kosa, both of Austin, Tex.

[73] Assignee: Motorola, Inc., Schaumburg, Ill.

[21] Appl. No.: 589,247

[22] Filed: Sep. 28, 1990

[51] Int. Cl.[5] ............... H01L 27/02; G11C 11/00; G11C 11/34

[52] U.S. Cl. .................................. 357/41; 357/51; 365/154; 365/182

[58] Field of Search .............. 357/41, 51, 59, 23.3; 365/154, 182

[56] References Cited

U.S. PATENT DOCUMENTS 4,849,801 7/1989 Honjyo et al. .................. 357/41

Primary Examiner—Mark Prenty
Attorney, Agent, or Firm—James L. Clingan, Jr.

[57] ABSTRACT

An integrated circuit device structure for a static random access memory includes a feature which improves soft error immunity. Each static random access memory has two storage nodes for storing data of that cell. Each of these nodes is at the connection of the drain of a pull-down transistor and the source-drain of a pass transistor which occurs in a doped region of the substrate in which the integrated circuit is formed. The soft error immunity is increased by increasing the capacitance of each of the storage nodes. This is achieved by providing only a thin insulating layer over the doped regions of the storage nodes and extending a portion of grounded, heavily-doped polysilicon over the doped regions. The ground polysilicon is then separated from the doped regions by only the thin insulating layer so there is thus substantial added capacitance to the storage nodes.

3 Claims, 4 Drawing Sheets

STATIC RAM CELL WITH SOFT ERROR IMMUNITY

FIELD OF THE INVENTION

The invention relates to static random access memory cells (SRAMs), and more particularly, to device structures for use in SRAM cells for improving immunity to soft errors.

BACKGROUND OF THE INVENTION

In static random access memories (SRAMs) there are typically two cross-coupled transistors, two pass transistors, and two resistors. The circuit diagram of SRAMs which use this typical two resistor approach is shown in FIG. 1. Memory cell 10 comprises cross-coupled N channel transistors 11 and 12, resistors 13 and 14, and N channel pass transistors 16 and 17. Pass transistors 16 and 17 are for coupling data stored by cross-coupled transistors 11 and 12 and resistors 13 and 14 to bit lines D and $\bar{D}$, respectively, in the form of complementary signals in the read mode. In the write mode, data from the bit lines are coupled to memory cell 10 via pass transistors 16 and 17. Pass transistors 16 and 17 are both coupled to a word line WL, which when active, enables transistors 16 and 17 for the purpose of performing their coupling function. Memory cell 10 also has nodes 18 and 19. Nodes 18 and 19 provide data to bit lines D and $\bar{D}$, respectively, when word line WL is enabled. Connected to node 18 are the gate of transistor 12, drain of transistor 11, a first terminal of resistor 13, and a current electrode of pass transistor 16. Similarly for node 19, the gate of transistor 11, the drain of transistor 12, a terminal of resistor 14, and a current electrode of transistor 17 are connected thereto. The sources of transistors 11 and 12 are connected to a negative power supply terminal which is typically ground. Second terminals of resistors 13 and 14 are connected to a positive power supply terminal $V_{CC}$ for receiving, for example, 5 volts. Transistors 11 and 12 act as pull-down transistors, and transistors 16 and 17 act as pass transistors.

Cell 10 stores a logic state based on the voltages at nodes 18 and 19 which also corresponds to the relative conductivities of transistors 11 and 12. A logic high is stored if node 18 is at a relatively high voltage and node 19 is at relatively low voltage. A logic low is stored if node 19 is at a relatively high voltage and node 18 is a relatively low voltage. The transistor which is conductive of transistors 11 and 12 is effective in drawing its drain to at or very near ground potential. The relatively high voltage, however, is significantly less than the voltage at $V_{CC}$ due to the voltage division between the relatively non-conductive transistor and the resistor to which its drain is connected. Resistors 13 and 14 are desirably very high resistance to minimize standby current. This very high resistance, however, has the effect of causing the node which is at the relatively high voltage to be reduced because of the leakage current through the transistor which is non-conductive. The voltage difference between nodes 18 and 19 is thus significantly less than that between the voltage at $V_{CC}$ and ground. The logic state stored in cell 10 is thus less stable than might be expected from a cross-coupled transistor pair.

Soft errors in dynamic random access memories (DRAMs) has been understood for quite some time as being caused primarily by the capacitor of one of the DRAM cells being struck by an alpha particle. The same phenomenon also occurs in SRAMs. An alpha particle striking one of the storage nodes, such as one of nodes 18 and 19, can cause the voltage on the storage node which is struck to change voltage sufficiently to cause the memory cell to change logic states. This is called a soft error. The amount of voltage change for a given alpha particle hit is inversely proportional to the capacitance on the storage node. Thus, a relatively large capacitance on the storage node reduces the amount of voltage change for a given alpha particle hit and accordingly reduces the changes of a soft error. Unfortunately, as the geometries are reduced, the capacitances on the storage nodes are also reduced. Thus, the propensity for soft errors increases as the device sizes are scaled down. There is thus an advantage to increasing the capacitance of a SRAM storage node. Such increase should not, however, increase the size of the memory. An increase in cell size would at least in part defeat the purpose of reduced geometries.

SUMMARY OF THE INVENTION

Accordingly, it is an object of the present invention to provide an improved SRAM cell.

Another object of the invention is to provide a SRAM cell with improved soft error immunity.

These and other objects are achieved in an integrated circuit having a semiconductor device structure formed in a substrate for use in a static random access memory cell. The device structure includes a storage node of the static random access memory cell which is formed in a first doped region in the substrate, a first transistor, a thin insulating layer, and a first layer of conductive material. The first transistor has a source formed in a second doped region in the substrate, a drain formed in a third doped region in the substrate and connected to the first doped region, and a gate formed over the substrate and between the second and third doped regions. The thin insulating layer is over at least a first portion of the first doped region. The first layer of conductive material overlies at least the portion of the insulating layer which is over the first portion of the first doped region.

DETAILED DESCRIPTION OF THE INVENTION

Figure 2:
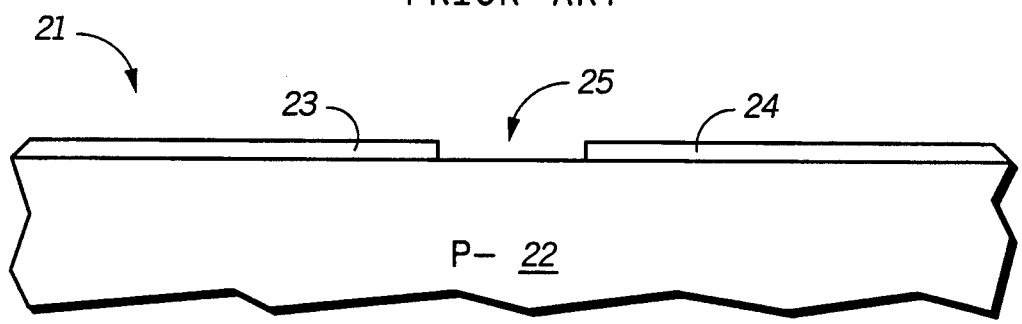
FIGS. 2–4 are cross-sections of a device structure at early stages in processing useful in implementing the circuit of FIG. 1 according to the prior art.

Shown in FIG. 2 is a cross section of a portion 21 of an integrated circuit device structure for use in making a SRAM cell which is preliminary to the device structure of the invention. Portion 21 comprises a P-silicon substrate 22, a thin oxide layer 23 overlying substrate 22, a thin oxide layer 24 overlying substrate 22, and an exposed region 25 on substrate 22 between oxide layers 23 and 24. Region 25 is formed in preparation of making a buried contact thereto. A selective etch of thin oxide results in leaving oxide layers 23 and 24.

Figure 3:
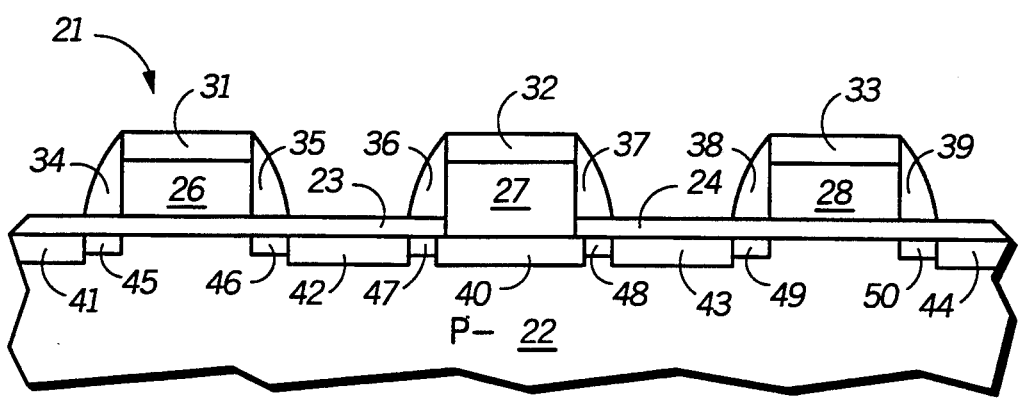

A first layer of polysilicon is then deposited over oxide layers 23 and 24 and region 25, heavily-doped to N-type by diffusion, and selectively etched to leave various portions of the first layer of polysilicon such as polysilicon layers 26, 27, and 28 as shown in FIG. 3. Polysilicon layer 27 is between polysilicon layers 26 and 28 and over and adjoining region 25. There is thus formed a buried contact with polysilicon layer 27 and region 25. Prior to the polysilicon layer being etched, an oxide layer is formed over the polysilicon layer so that after etching, there are oxide layers 31, 32, and 33 over polysilicon layers 26, 27, and 28, respectively. After formation of polysilicon layers 26, 27, and 28, a light N-type implant is performed using polysilicon layers 26, 27, and 28 as a mask. Nitride is then deposited and anisotropically etched to form sidewall spacers 34 and 35 on the sides of polysilicon layer 26, sidewall spacers 36 and 37 on the sides of polysilicon layer 27, and sidewall spacers 38 and 39 on the sides of polysilicon layer 28. A heavy N-type implant is then performed using polysilicon layers 26-28 and sidewall spacers 34-39 as a mask. The result of the light and heavy implants and a subsequent heating step to set the implants is the formation of N+regions 40, 41, 42, 43 and 44 and N-regions 45, 46, 47, 48, 49, and 50 in substrate 22 as shown in FIG. 3. Region 42 is between sidewall spacers 35 and 36. Region 43 is between sidewall spacers 37 and 38. Regions 45, 46, 47, 48, 49, and 50 are under sidewall spacers 34, 35, 36, 37, 38, and 39, respectively. Region 41 adjoins region 45 and extends away from sidewall spacer 34 along the surface of substrate 22. Similarly, region 44 adjoins region 50 and extends away from sidewall spacer 39. Region 40 is formed by diffusion from polysilicon layer 27. Polysilicon layer 27 is heavily doped by diffusion and the light and heavy implants. Because of the grain boundaries in polysilicon, the diffusion into substrate 22 is very rapid.

Figure 1:
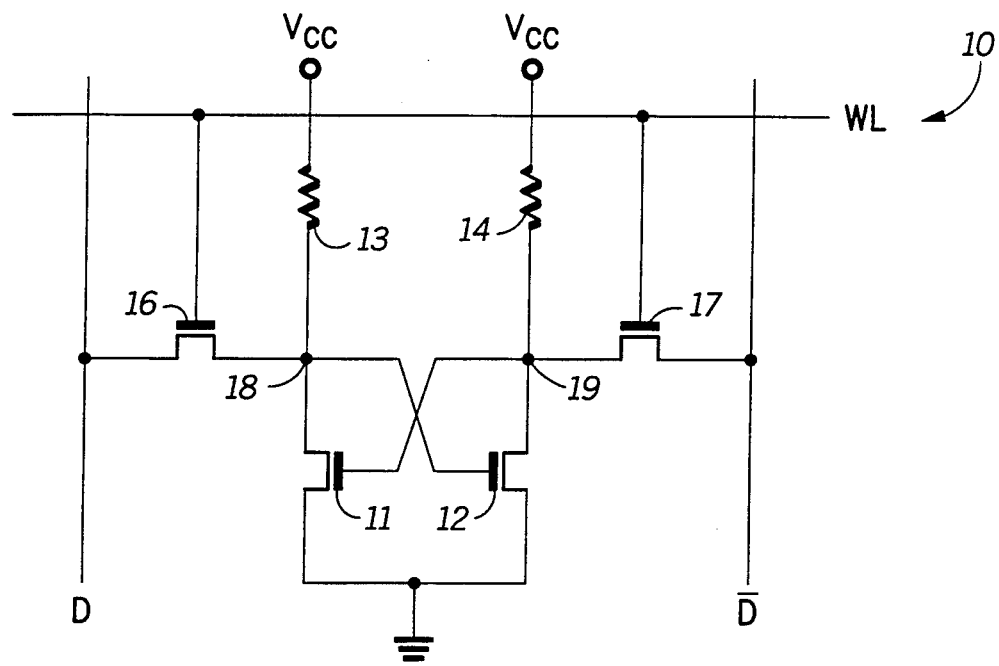
FIG. 1 is a circuit diagram of a SRAM cell which is commonly used in the prior art.
Figure 8:
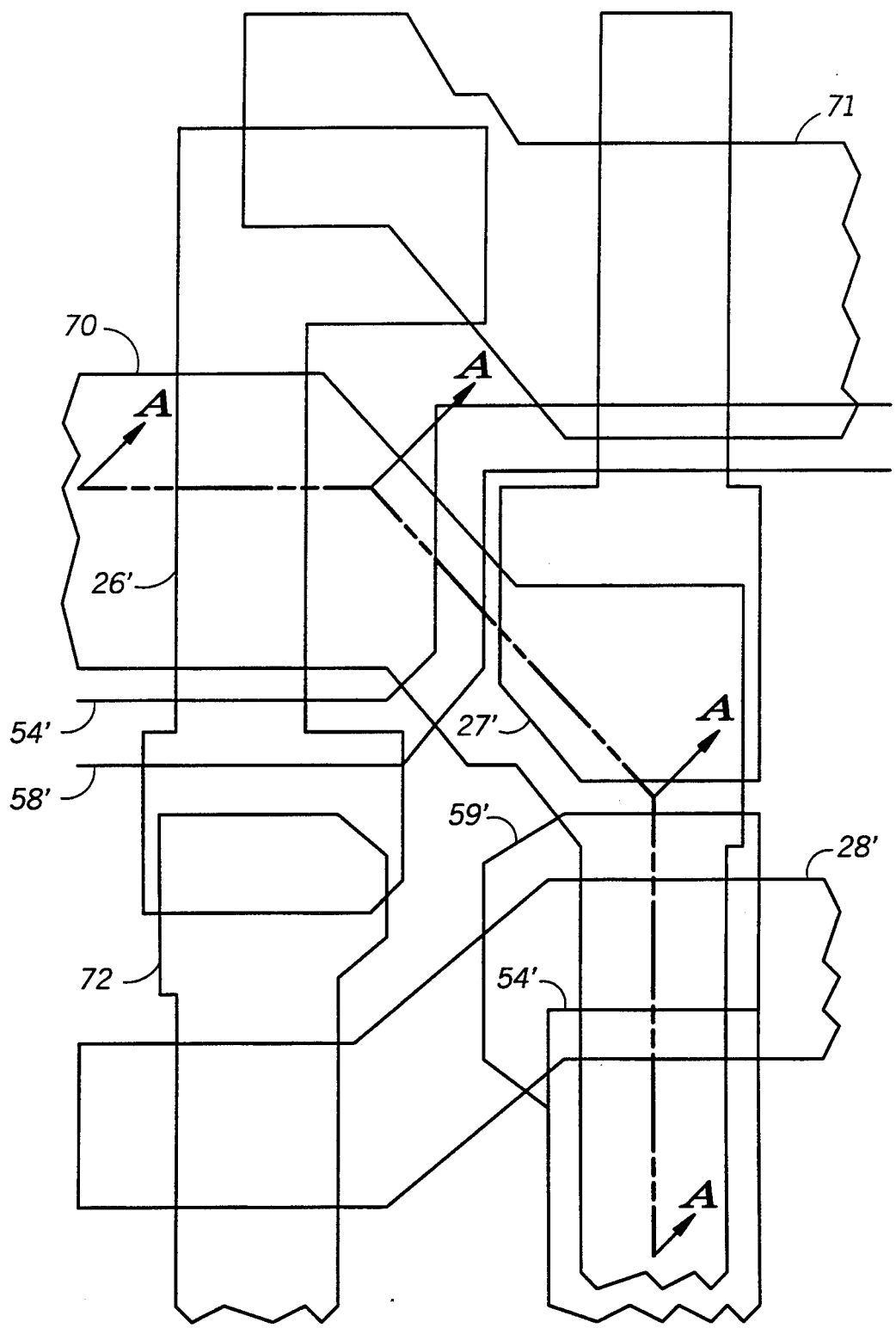
FIG. 8 is a preferred layout for implementing the device structure of FIG. 7.

The structure shown in FIG. 3 is useful in obtaining SRAM cell 10 shown in FIG. 1. This structure is two transistors useful for being either transistors 16 and 11 or transistors 17 and 12. Assuming transistors 16 and 11 are provided, polysilicon layer 26 is the gate of transistor 11, region 41 is the source of transistor 11, and region 46 is the drain of transistor 11. Region 41 is for contacting ground to region 45. Region 42 is part of node 18 and is connected to region 46. Polysilicon layer 28 is the gate of transistor 16, region 50 is one of the source/drains of transistor 16, and region 49 is the other source/drain of transistor 16. Region 44 is for contacting bit line D to region 50. Region 43 is part of node 18 and is connected to region 49. Polysilicon layer 27 is an extension of the gate of transistor 12 which is connected to node 18 via region 40. Region 40, over various heat cycles, will merge with regions 42 and 43 so that there will be continuous N+conductivity between regions 46 and 49. There is of course substantial additional structure provided by additional processing. A second layer of polysilicon is an interconnect layer. A third layer of polysilicon is the layer used for resistors 13 and 14. Two metal layers are used for connecting to second polysilicon for strapping word lines and providing ground connections and for providing bit lines. The configuration of FIG. 3 is known in the art. The structure of FIG. 3 is shown with polysilicon layers 26-28 aligned in a manner in which a single straight-line cross-section intersects all three, whereas in actual practice the arrangement will be made as compact as possible which is likely to result in an arrangement in which the cross-section, in order to intersect all three, would have to be other than a single straight-line. The preferred layout is shown in FIG. 8.

Figure 4:
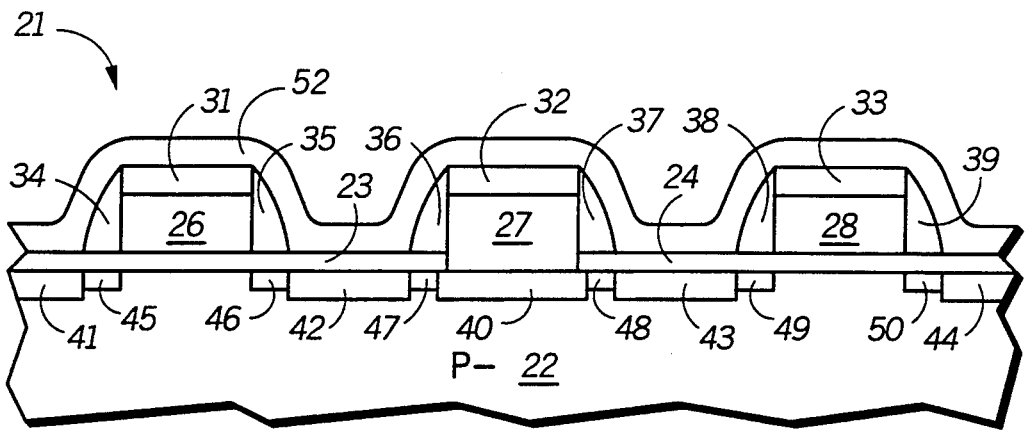

After the device structure of FIG. 3 is obtained, an interlayer dielectric 52, such as an oxide, is formed over substrate 22 as shown in FIG. 4. Interlayer dielectric 52 is for providing additional separation of the portions of the first layer of polysilicon from portions of the second layer of polysilicon which will be subsequently formed and selectively etched. The second polysilicon layer is intended to be part of the ground contact for transistor 11 and thus contact region 41 and to part of the bit line D contact and thus contact region 44. To accommodate this intended purpose for the second layer of polysilicon, dielectric layer 52 has been removed over region 41 and region 44. To expose regions 41 and 44, the portions of oxide layers 23 and 24 exposed by the removal of the portions of dielectric layer 52 are also removed. The second layer of polysilicon will thus be in contact with regions 41 and 44. The selective removal of the portions of the second layer of polysilicon leaves the desired portions of polysilicon in contact with regions 41 and 44. This just described patterning of interlayer dielectric and subsequent formation and etching of polysilicon is conventional.

Figure 5:
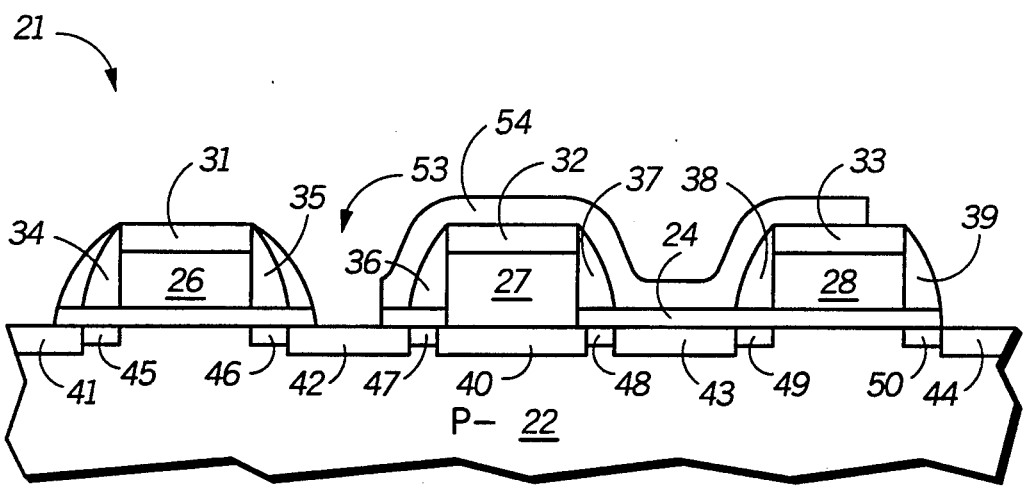
FIGS. 5–7 are cross sections of a device structure at early stages in processing useful in implementing the circuit of FIG. 1 according to the invention.
Figure 6:
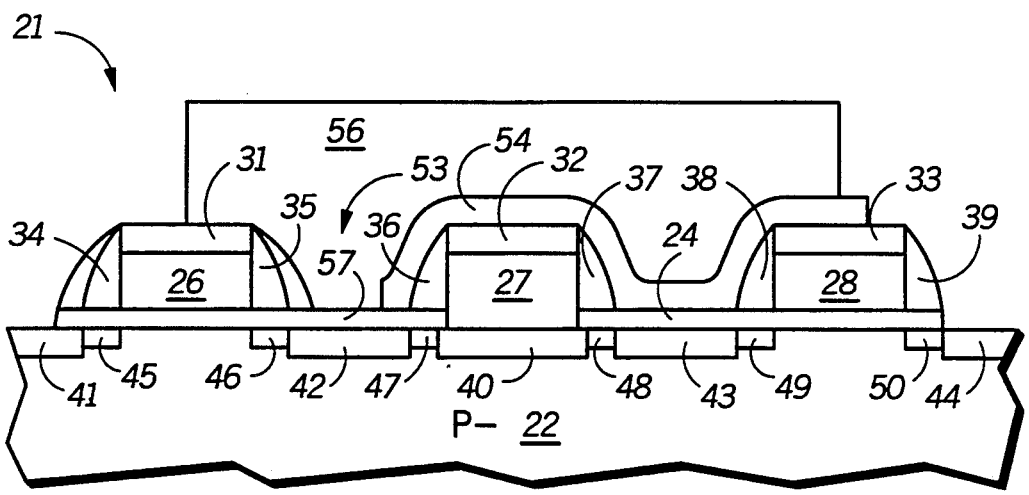

Interlayer dielectric 52 is not merely selectively etched as in the conventional pattern to expose regions 41 and 44 but is also etched over at least a portion of region 42 to expose a portion 53 of region 42. The etching of dielectric layer 52 leaves a dielectric portion 54 over polysilicon layer 27, region 43, and a portion of polysilicon layer 28 as shown in FIG. 5. A thin oxide layer is then grown over regions 41, 42, and 44 and a photoresist mask 56 is formed to cover region 42 in order to remove the thin oxide over regions 41 and 44 to leave a thin oxide layer 57 over region 42 as shown in FIG. 6. This mask 54 need not be very precise. This mask does not add to any other cumulative misalignment tolerances. After the etch using the pattern of photoresist layer 54 as a mask, regions 41 and 44 are exposed. The etch is anisotropic so leaves sidewall spacers on adjacent to sidewall spacers 34 and 35.

Figure 7:
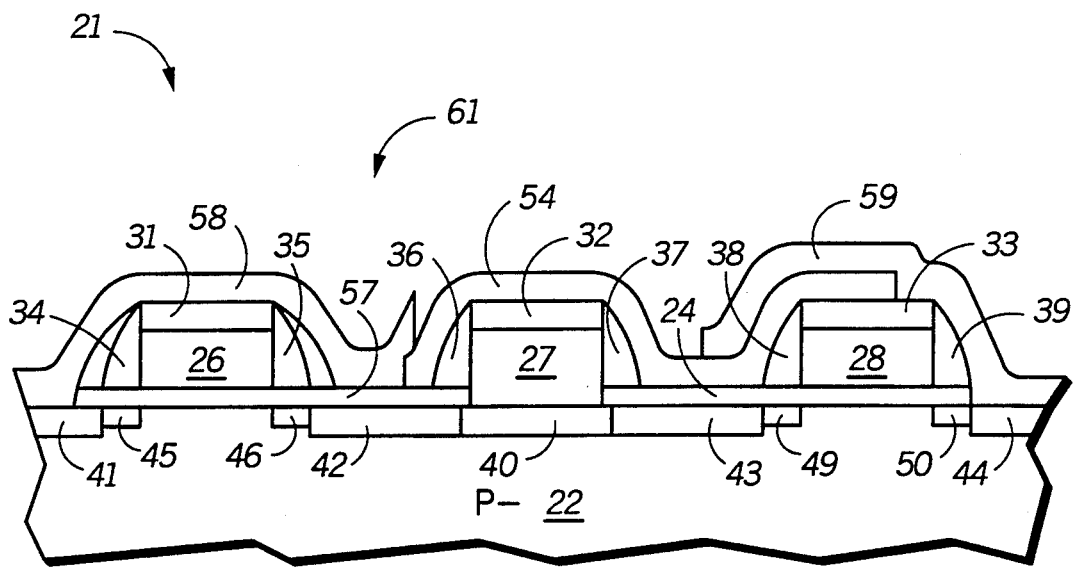

The second layer of polysilicon is then formed over substrate 22 and selectively etched. The selective etch leaves a polysilicon layer 58 over and in contact with region 41, over polysilicon layer 26, and over region 42 and leaves a polysilicon layer 59 over and in contact with region 44, over region 28, and over a portion of region 43 as shown in FIG. 7. Thin oxide layer 57 acts as a dielectric for a capacitor 61 in which one of the plates of capacitor 61 is region 42 and the other is the portion of polysilicon layer 56 which is over thin oxide layer 57. This adds significant capacitance to node 18 not previously present. In the past the interlayer dielectric was not removed from over the region in the substrate which provided the node 18 connection and the polysilicon which provided the ground connection did not extend over this node 18 region in the substrate. Thin oxide 57 is about 200 Angstroms but could be either more or less. The thickness is desirably less than 500 Angstroms. Less thickness provides more capacitance, but more thickness provides more margin for reliable operation. Dielectric layer 54 is about 3000 Angstroms so thin oxide 57 provides much more capacitance than if polysilicon were simply over region 42 but separated by interlayer dielectric. Removing the interlayer dielectric from over region 42 and growing thin oxide has not been the previous approach but is useful in increasing the capacitance of node 18.

Subsequent processing provides for a third polysilicon layer for resistors 13 and 14. Resistor 13 must also connect to node 18. This is achieved by a contact to polysilicon layer 27. Thus, polysilicon layer 27 cannot be covered by the second polysilicon layer which is why polysilicon layer 58 does not extend to cover polysilicon layer 27. Subsequent processing also provides for a metal bit line and a metal ground line which connect directly to polysilicon layers 59 and 58, respectively. The metal contact is actually made to polysilicon layer 59 over polysilicon layer 28. Thus, due to the metal contact to polysilicon layer 59 and the third layer of polysilicon contacting polysilicon layer 27, polysilicon layer 58 is prevented from extending over polysilicon layer 27 and region 43 which are potentially areas where additional capacitance to node 18 could be obtained. Because polysilicon layer 58 is prevented from extending to polysilicon layer 27 and region 43, interlayer dielectric 54 is also retained in those areas. With different layout constraints it could be possible to add even more capacitance. Capacitor 61 is obtained without any additional area required.

Figure 9:
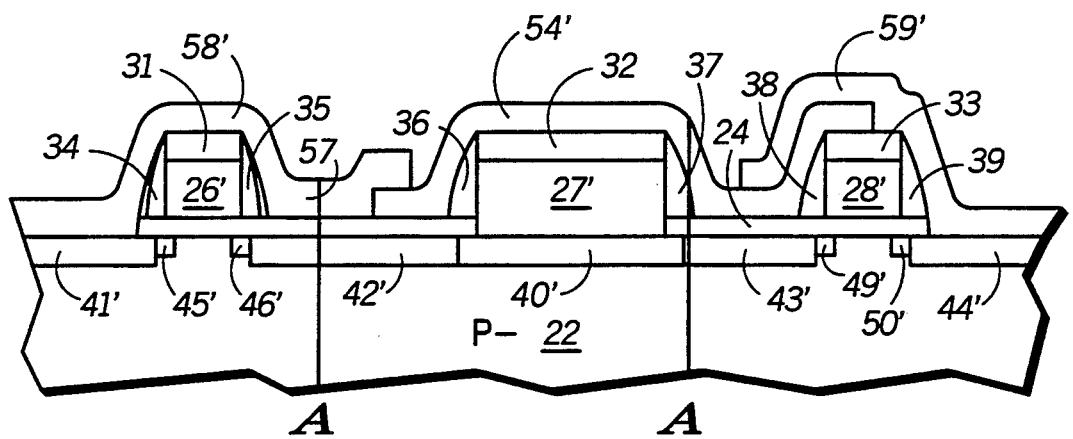
FIG. 9 is a cross-section of the layout of FIG. 8.

In the preferred layout shown in FIG. 8, there are shown four transistors connected as shown in FIG. 1 in three active regions. Elements analogous to those shown in FIG. 7 are designated with the same base number with a prime (') added. The three active regions are 70, 71 and 72. Transistors 16 and 11 are in active region 70. Transistor 12 is in active region 71. Transistor 17 is in active region 72. A cross section taken at A—A—A—A is shown in FIG. 9. The node 18 contact is formed in active region 70 using polysilicon layer 27' which extends to active region 71 and forms the gate of transistor 12. Polysilicon layer 26' extends to contact both active regions 71 and 72 by buried contact. One buried contact is the overlap of polysilicon layer 26' with active region 72 and the other is the overlap of polysilicon layer 26' with active region 71. Node 19 is thus shared in both active regions 71 and 72 as well as by polysilicon layer 26'. The additional capacitance for node 19 is provided in active region 71 between polysilicon layer 26' and polysilicon layer 27' where the interlayer dielectric has been removed. Polysilicon layer 58' covers all of active region 71 shown in FIG. 8 and makes contact with the relevant portion thereof to provide the ground contact for transistor 12. Resistors 13 and 14 are formed in a third polysilicon layer which is not shown in FIG. 8. At the stage in processing shown in FIG. 8, interlayer dielectric extends below the line designated 54' except for the area enclosed and marked 54' in the lower right portion of FIG. 8. Polysilicon layer 28' is the word line WL and extends from the lower right portion of active 70 to active region 72 and is the gate of transistors 16 and 17. There is a buried contact between polysilicon layer 27' and active region 70 where polysilicon layer 27' overlaps active region 70.

FIG. 9 shows the similarity between the device structure of FIG. 7 and the cross-section A—A—A—A of FIG. 8. Because the elements of FIG. 8 which are analogous to those of FIG. 7 are not in a straight line, a cross-section which is in three different, but connected, straight lines are depicted in FIG. 9. This causes a distortion of some portions of the two outer cross-sections which are viewed at about a 45 degree angle instead of the normal 90 degree angle which applies only to the middle cross-section in this case. Vertical lines in FIG. 9 show the locations of the change in direction of the cross-sections.

While the invention has been described in a specific embodiment, it will be apparent to those skilled in the art that the disclosed invention may be modified in numerous ways and may assume many embodiments other than those specifically set out and described above. For example, different materials may be used. Also the location of various contact points may alter where the extra storage node capacitance is physically located. Another layout might allow for the extra storage node capacitance to extend all the way from the gate of the pull-down transistor to the pass transistor. Accordingly, it is intended by the appended claims to cover all modifications of the invention which fall within the true spirit and scope of the invention.

We claim:

1. An integrated circuit having a semiconductor device structure formed in a substrate for use in a static random access memory cell in which a storage node of the static random access memory cell is formed in a first doped region in the substrate, comprising:
 a first transistor having a source formed in a second doped region in the substrate, a drain formed in a third doped region in the substrate and connected to the first doped region, a gate formed over the substrate and between the second and third doped regions;
 a second transistor having a first source/drain region formed in a fourth doped region, a second source/drain region formed in a fifth doped region connected to the first doped region, and a gate formed over the substrate and between the fourth and fifth doped regions;
 a thin insulating layer over at least a first portion of the first doped region, wherein the thin insulating layer is of a thickness less than 500 Angstroms; and
 a first layer of conductive material connected to the source of the first transistor and overlying at least the portion of the thin insulating layer which is over the first portion of the first doped region.

2. An integrated circuit having a semiconductor device structure formed in a substrate for use in a static random access memory cell in which a storage node of the static random access memory cell is formed in a first doped region in the substrate, comprising:
 a first transistor having a source formed in a second doped region in the substrate, a drain formed in a third doped region in the substrate and connected to the first doped region, and a gate formed over the substrate and between the second and third doped regions;
 a thin insulating layer over at least a first portion of the first doped region, wherein the thin insulating layer is of a thickness less than 500 Angstroms; and
 a first layer of conductive material overlying at least the portion of the thin insulating layer which is over the first portion of the first doped region.

3. An integrated circuit having a semiconductor device structure formed in a substrate for use in a static random access memory cell in which a storage node of the static random access memory cell is formed in a first doped region in the substrate, comprising:
 a first transistor having a source formed in a second doped region in the substrate, a drain formed in a third doped region in the substrate and connected to the first doped region, a first polysilicon gate formed over the substrate and between the second and third doped regions, and a first sidewall spacer adjoining the first polysilicon gate and over the second and third doped regions;

a second transistor having a first source/drain region formed in a fourth doped region, a second source/drain region formed in a fifth doped region electrically connected to the first doped region, and a second polysilicon gate formed over the substrate and between the fourth and fifth doped regions, and a second sidewall spacer adjoining the second polysilicon gate and over the fourth and fifth doped regions;

a thin insulating layer over at least a first portion of the first doped region, wherein the thin insulating layer is of a thickness less than 500 Angstroms; and a first polysilicon layer electrically connected to the source of the first transistor and overlying at least the portion of the thin insulating layer which is over the first portion of the first doped region.

* * * * *

UNITED STATES PATENT AND TRADEMARK OFFICE
CERTIFICATE OF CORRECTION

PATENT NO. : 5,057,893
DATED : October 15, 1991
INVENTOR(S) : David Sheng et al It is certified that error appears in the above-identified patent and that said Letters Patent is hereby corrected as shown below:

Column 6, Line 38, change "thicknes" to --thickness--.

Signed and Sealed this

Sixteenth Day of March, 1993

Attest:

STEPHEN G. KUNIN

*Attesting Officer*          *Acting Commissioner of Patents and Trademarks*